United States Patent
Gates et al.

(10) Patent No.: US 6,187,507 B1
(45) Date of Patent: Feb. 13, 2001

(54) PRESENSITIZED PRINTING PLATES

(75) Inventors: Allen Peter Gates, Knaresborough (GB); Jonathan William Goodin, Delta (CA); John Michael Kitteridge, Leeds (GB); Malcolm James Mallison, Leeds (GB); Roland Robinson, Leeds (GB); Philip John Watkiss, Leeds (GB)

(73) Assignee: Agfa-Gevaert, N.V, Mortsel (BE)

( * ) Notice: Under 35 U.S.C. 154(b), the term of this patent shall be extended for 0 days.

(21) Appl. No.: 09/403,268

(22) PCT Filed: Apr. 16, 1998

(86) PCT No.: PCT/EP98/02191
 § 371 Date: Dec. 15, 1999
 § 102(e) Date: Dec. 15, 1999

(87) PCT Pub. No.: WO98/47719
 PCT Pub. Date: Oct. 29, 1998

(30) Foreign Application Priority Data

Apr. 18, 1997 (GB) .................................... 9707930

(51) Int. Cl.$^7$ ...................................... G03F 7/004

(52) U.S. Cl. ....................... 430/271.1; 430/523; 430/531; 430/537

(58) Field of Search .............................. 430/271.1, 272.1, 430/523, 525, 531, 537

(56) References Cited

FOREIGN PATENT DOCUMENTS 0 490 515 * 6/1992 (EP) .
0 794 459 * 9/1997 (EP) .

* cited by examiner

Primary Examiner—Hoa Van Le
(74) Attorney, Agent, or Firm—Breiner & Breiner

(57) ABSTRACT

The invention provides a lithographic printing plate precursor comprising a grained and anodized aluminium substrate having coated thereon a silver halide emulsion layer, the back surface of said substrate being coated with an inert coating which does not chemically or physically interact with an adjacent silver halide layer when two plates are placed in front to back contact. Fogging of the silver halide layer is avoided and the use of the back coating eliminates the requirement for the use of tissue interleaving when wrapping and packing the lithographic printing plate precursors.

11 Claims, No Drawings

PRESENSITIZED PRINTING PLATES

The present invention relates to a presensitised plate for use as a precursor in making a lithographic printing plate. More specifically it is concerned with a presensitised plate comprising a substrate having coated thereon a light sensitive layer including a silver halide emulsion, and also incorporating a further coating layer which is applied onto the back face of the substrate.

Silver halides are used for printing plate applications in a number of ways. Suitable coatings include, for example, the single sheet diffusion transfer type, as described in European Patents Nos. 131462 and 278766, in which a developer is applied to chemically develop exposed areas of a photosensitive coating, whilst at the same time physically developing the unexposed areas. In the unexposed areas, soluble silver complexes diffuse to a nucleation layer where metallic silver is formed by reduction and can be made oleophilic for use as the printing image of a lithographic printing plate.

Tanning development type coatings, such as described in British Patents Nos. 1547040, 1547350, 1567844, 1571155 and 1590058, and which comprise a silver halide in combination with gelatin or other matrix binder, are also suitable. Such systems involve oxidised developing agent, which is generated on development of exposed silver halide, crosslinking the gelatin or other matrix binder, so providing a tough, ink-receptive image.

Amongst other suitable coatings which can be employed are coatings which employ a silver halide layer as a mask on top of a conventional photopolymerisable layer, such as described in British Patents Nos. 1227603, 2052084, 2057154 and 2065318, coatings which involve crosslinking of polymers on development, such as described in British Patent No. 2040060 and European Patent No. 52942, and coatings which rely on silver halide initiation of polymerisation on development, such as described in U.S. Pat. Nos. 4,547,450, 4,859,568 and 4,879,201. In each case, the image area is oleophilic during printing operations.

The substrate used as the base material for the plate precursor forms the non-image areas of the final printing plate and it is necessary, therefore, that it should provide a hydrophilic surface in order that ink acceptance in non-image areas is prevented. Particularly favourable results are achieved with aluminium substrates in which the surface is grained and anodised. Optionally the aluminium may be laminated on one side to another material, preferably a plastic material.

Whilst being a particularly suitable base material for lithographic applications, however, it has to be borne in mind that aluminium is a reactive metal. Indeed, it is readily oxidised so that, in contact with air, a protective barrier is formed by reaction with atmospheric oxygen. However, if the protective barrier becomes damaged, the revealed aluminium surface is again reactive. In cases when such a damaged surface is in contact with silver halide emulsions, the resulting chemical interactions cause fogging of the emulsion such that it becomes of no use for its intended application.

Advantageously, lithographic printing plate precursors comprise an aluminium substrate which is mechanically or electrochemically grained to roughen the surface, and then electrochemically anodised such that an anodic film of aluminium oxide is formed on the roughened surface, one or more radiation sensitive layers then being coated on the anodised surface layer. Generally the coating and anodic layers provide a good degree of protection to the underlying aluminium, and it is more usual for damage to occur to the unprotected back surface of the aluminium substrate.

Mechanical damage to plates in the form of scratches can typically occur in the course of manufacture, or during operations such as stacking and transportation; indeed, the simple act of removing a plate from a pack of plates can result in damage to the plate. Most commonly, however, scratching of the plates occurs during the manufacturing process. Problems can then arise as a consequence of the continuous nature of this process, whereby plates can be stacked face-to-back within a few seconds of a scratch occurring; in such circumstances a revealed aluminium surface on the back of a plate will come into contact with a silver halide layer on the front of an adjacent plate, and there is the immediate potential for fogging of that layer to occur. Additionally, burred edges of plates and debris are often encountered together with scratches, and these are found to be equally as detrimental to the plates as the scratches themselves.

In order to overcome such difficulties, plate manufacturers have traditionally utilised tissue paper to provide interleaving between adjacent plates. Thus, contact between plates can be prevented, and scratches on the back surface of plates cannot cause damage to the silver halide layers of adjacent plates. Furthermore, scratching during transportation or when plates are removed from packs is eliminated by virtue of this interleaving.

Unfortunately, however, there are disadvantages associated with the use of interleaving paper. In particular, with the current trend towards Computer-to-Platesystems for pre-press work, which has resulted in increasing utilisation of automatic plate-feed devices, the presence of interleaving paper creates serious complications. Such devices are designed to mechanically remove a plate from a stack and load it onto an exposure device but, when tissue interleaving is present, additional machinery is required in order to mechanically de-interleave the plates and this, inevitably, leads to significant additional expense.

It is an objective of the present invention to eliminate the requirement for the use of tissue interleaving with lithographic printing plate precursors which incorporate a silver halide emulsion layer.

The use of the so-called back coatings on certain types of lithographic printing plate precursors has previously been disclosed. For example, European Patent Application No. 91310848.6 is concerned with a method for preparing a lithographic printing plate which involves the use of a developer comprising an aqueous solution of an alkali metal silicate, and wherein the back face of the substrate is coated with an organic polymeric compound in order to prevent attack by the developer on the anodic layer on this face, thereby preventing formation of insoluble material in the developer and extending developer life. European Patent Application No. 93111404.5, on the other hand, attempts to overcome the problem of developer contamination by providing a back surface coating comprising a layer of metal oxide. Difficulties associated with the handling of plates in which a mat layer is coated on top of the light sensitive layer are addressed in European Patent Application No. 92113982.0 which, like the earlier Application No. 91310848.6, also proposes the use of a back coating comprising an organic polymeric compound.

None of the prior art, however, considers the use of a back coat layer in conjunction with a silver halide emulsion layer, and the potential for chemical interactions which may cause fogging of the silver halide layer. The use of a metal oxide back coat layer, for example, would be totally inappropriate in such a situation. Consequently, it is a further objective of the present invention to provide an inert coating on the back surface of aluminium based lithographic printing plate precursors incorporating a silver halide emulsion layer such that chemical interactions involving the silver halide layer are prevented.

According to the present invention, there is provided a lithographic printing plate precursor comprising a grained and anodised aluminium substrate having coated thereon a silver halide emulsion layer and wherein the back surface of the substrate is coated with an inert coating.

The term "inert", as applied to the coating, means that the coating does not chemically or physically interact with an adjacent silver halide layer when two plates are placed in front to back contact.

Said inert coating may be applied as a continuous film, using a solution of a film-forming polymer or a latex, or may be applied as a discontinuous layer, by coating a dispersion or spraying a powder onto the back surface of the plate precursor.

In order to fulfil the function of preventing damage to the silver halide emulsion layer, the back coat layer should be of sufficient thickness to cover existing scratches, burrs and debris, and to prevent damage occurring as a result of scratches, burrs and debris which are formed after application of the coating. Consequently, the back coat layer should be applied to the plate such that a coating thickness of at least 0.1 micron is achieved. Preferably, the back coat layer is applied at a coating weight of 0.5–2.0 g/m² in order to meet this criterion.

It is preferred that the back coating layer should be insoluble in alkali, thereby showing resistance to alkaline developers used in the development process. It is also preferable that the back coating layer should be resistant to chemicals which are encountered in the pressroom, which typically include inks, solvents, fount solutions and gums, thus ensuring that adverse effects on press are avoided.

Suitable coating materials for the back coat layer include those which are sufficiently inert to avoid chemical interactions with the silver halide emulsion and which show resistance to the chemicals encountered during processing and use, thereby avoiding problems due to swelling or decoating of the layer which can, for example, cause plates to stick to cylinders on the press. Preferred polymer compositions are those which produce good films when dried at temperatures above ambient, typically above 40° C. In addition, the dried films should not cause adhesion between plates or impair the ease with which the plates can be removed from a pack or stack either manually or by means of mechanical plate transport systems. Typical materials include synthetic polymers such as poly(acrylates), poly (urethanes), poly(alkenes), poly(siloxanes), poly(styrenes), cresol novolak resins and the like, and natural polymers, for example gelatin. Preferably an acrylic polymer latex may be employed.

The back coating is applied to the lithographic printing plate precursors following application of the light sensitive silver halide emulsion layer, and before cutting and stacking of the finished plates. The coating may be applied by means of conventional coating methods such as gravure, nip or metered roller methods, or by dip coating, slot coating or spraying techniques, including electrostatic spraying techniques. Suitable vehicles for application of the coating include solvent solutions and aqueous emulsions or dispersions.

Improvements may be effected by the inclusion of various additives in the coating formulation. Thus, for example, enhanced coating appearance may result from the addition of surfactants or waxes, and a visible coating may be obtained by including dyes or pigments. Additionally, improved chemical or scratch resistance is achieved via the use of crosslinking agents which promote crosslinking on irradiation with UV light, and increased adhesion to the substrate and flexibility of the back coating are associated with the addition of plasticisers to the coatings.

Prior to the application of the back coating, the lithographic printing plate precursors of the present invention comprise a grained and anodised aluminium substrate having coated thereon a silver halide emulsion layer. Typically, the aluminium is degreased prior to electrochemically graining in a solution of inorganic and/or organic acids, for example a mixture of nitric and acetic acids; the roughened substrate is then desmutted and electrochemically anodised in an aqueous acidic solution, such as sulphuric or phosphoric acid. Additionally, a post anodic treatment, for example a washing treatment, may be included prior to application of the light sensitive silver halide coating, which may be of the diffusion transfer type, the tanning development type, or may be any other suitable silver halide based system from the prior art. Optionally, the aluminium substrate may be laminated on its back face to a suitable plastic material, onto which the back coating layer is then applied.

The following experiments are illustrative of the invention:

EXPERIMENTS

Visible scratches were induced on the back of an electrochemically grained and anodised aluminium substrate by means of a steel pin. Typically, these scratches were 50 to 100 microns wide, 0.5 to 1 micron deep and 50 mm long. Samples of scratched substrate were then treated in the following ways:
1. An acrylic, water based latex (Joncryl 537 from Johnson plc) was coated over the scratched surface of the above prepared substrate by a reverse roll gravure method to give coating weights, after drying at 80° C., of a) 1.3 gm/m², b) 0.5 gm/m² and c) 0.2 gm/m².
2. A solution of Epikote® 1007 in MEK was coated over the scratched surface of the above prepared substrate by a wire bar method to give coating weights, after drying at 50° C., of a) 1.3 gm/m², b) 0.5 gm/m² and c) 0.2 gm/m².
3. A sheet of PET film with a silicone release adhesive on the back was applied to the scratched surface of the substrate by means of a roller bar.
4. A UV curable lacquer was gravure coated over the scratched surface of a substrate sample followed by exposure to a UV lamp to cure the lacquer and give a coating weight of 1.0 gm/m².
5. A sol-gel reaction mixture comprising an aqueous-ethanolic solution of tetraethylsilicate was coated over the scratched substrate sample and dried at 100° C. for 30 seconds to give a coat weight of approximately 0.2 gm/m².
6. No treatment was given to the scratched surface.
7. A sheet of 35 gm/m² tissue paper was placed over the scratched substrate sample without any coating being applied.

Copoer Sulphate Test

A solution of 10% copper sulphate and 10% hydrochloric acid was prepared. Each of the above samples was immersed in this solution for 1 minute. An un-scratched plate shows no copper deposits but scratches or other physical damage are revealed by prominent deposits of copper.

Scratch Test and Press Test

A commercially available aluminium diffusion transfer (DTR) printing plate (Silverlith® SDB from DuPont Printing and Publishing, which comprises an electrochemically grained and anodised aluminium surface coated, in order, with a layer of physical development nucleation particles and a gelatino silver chlorobromide emulsion, was placed in contact with the above illustrative samples such that the emulsion side of the printing plate was in contact with the scratched and treated side of the aluminium substrate. The pack combination was wrapped in light and humidity proof wrapping and stored at 60° C. for 5 days to simulate ageing. Afterwards, the DTR printing plates were developed for 30 seconds at 20° C. in a solution comprising 10% sodium sulphite, 2% hydroquinone, 2% sodium hydroxide, 0.6% Phenidone®, 1% hypo and 3% 2-methylaminoethanol, washed in Water at 30° C. for 15 seconds and rubbed with the following solution: 10% dextrin, 5% PEG200, 2% boric acid, 4% triethanolamine, 0.1% phenylmercaptotetrazole and 1% trypsin. On examination of the thus processed plates, defects associated with the interaction between the scratch and the gelatino silver chlorobromide emulsion could be seen (scratch test). These defects also showed on copy when the plates were run on a Drent® web offset press (press test).

The following table summarises the results obtained from the comparative examples above and demonstrates the advantage of the invention.

| Sample | Copper Sulphate Test | Scratch Test | Press Test |
| --- | --- | --- | --- |
| 1a | no deposit | none seen | good |
| 1b | no deposit | none seen | good |
| 1c | deposit | scratches seen | scratches on copy |
| 2a | no deposit | none seen | good |
| 2b | no deposit | none seen | good |
| 2c | deposit | scratches seen | scratches on copy |
| 3 | no deposit | none seen | good |
| 4 | no deposit | none seen | good |
| 5 | no deposit | none seen | good |
| 6 | deposit | scratches seen | scratches on copy |
| 7 | deposit | none seen | good |

What is claimed is:

1. A lithographic printing plate precursor comprising a grained and anodized aluminum substrate having coated thereon a silver halide emulsion layer and wherein the back surface of the substrate is coated with an inert coating, said inert coating having a coating thickness of at least 0.1 micron.

2. A lithographic printing plate precursor as defined in claim 1 wherein said inert coating is applied at a coating weight of 0.5 to 2.0 g/m$^2$.

3. A lithographic printing plate precursor as defined in claim 1 wherein said inert coating comprises a continuous film of a film-forming polymer or latex.

4. A lithographic printing plate precursor as defined in claim 1 wherein said inert coating is insoluble in alkali.

5. A lithographic printing plate precursor as defined in claim 1 wherein said inert coating is resistant to pressroom chemicals.

6. A lithographic printing plate precursor as defined in claim 1 wherein said inert coating comprises a poly (acrylate) poly(urethane), poly(alkene), poly(siloxane), poly (styrene) or cresol novolak resin or gelatin.

7. A lithographic printing plate precursor as defined in claim 1 wherein said inert coating comprises a UV-curable lacquer.

8. A lithographic printing plate precursor as defined in claim 1 wherein said inert coating comprises a discontinuous layer, obtained by coating a dispersion or spraying a powder on to the back surface of the plate precursor.

9. A lithographic printing plate precursor as defined in claim 1 wherein said inert coating additionally comprises at least one further constituent selected from surfactants, waxes, dyes, pigments, crosslinking agents and plasticizers.

10. A method of producing a lithographic printing plate precursor as defined in claim 1 comprising:

a) providing a grained and anodized aluminum substrate;

b) applying a silver halide emulsion layer to the grained and anodized surface;

c) applying an inert coating to the back surface of the substrate; and d) cutting to size.

11. A method as defined in claim 10 wherein said inert coating is applied to the back surface of the substrate by gravure coating, nip coating, metered roller coating, dip coating, slot coating, spraying or electrostatic spraying.

* * * * *